(12) United States Patent
Kim et al.

(10) Patent No.: US 11,483,003 B2
(45) Date of Patent: Oct. 25, 2022

(54) PSEUDO-COMPLEMENTARY LOGIC NETWORK

(71) Applicant: POSTECH Research and Business Development Foundation, Pohang-si (KR)

(72) Inventors: Eun Hwan Kim, Pohang-si (KR); Jae-Joon Kim, Pohang-si (KR)

(73) Assignee: POSTECH RESEARCH AND BUSINESS DEVELOPMENT FOUNDATION, Pohang-si (KR)

( * ) Notice: Subject to any disclaimer, the term of this patent is extended or adjusted under 35 U.S.C. 154(b) by 0 days.

(21) Appl. No.: 17/298,917

(22) PCT Filed: Dec. 9, 2019

(86) PCT No.: PCT/KR2019/017283
§ 371 (c)(1),
(2) Date: Jun. 1, 2021

(87) PCT Pub. No.: WO2020/122524
PCT Pub. Date: Jun. 18, 2020

(65) Prior Publication Data
US 2022/0069821 A1   Mar. 3, 2022

(30) Foreign Application Priority Data
Dec. 10, 2018   (KR) .......................... 10-2018-0158357

(51) Int. Cl.
*H03K 19/0944*   (2006.01)

(52) U.S. Cl.
CPC .............................. *H03K 19/0944* (2013.01)

(58) Field of Classification Search
None
See application file for complete search history.

(56) References Cited

U.S. PATENT DOCUMENTS

2013/0170607 A1*  7/2013  Matsui .......... H03K 19/017509
377/77

FOREIGN PATENT DOCUMENTS

| JP | 05-235744 A | 9/1993 |
|---|---|---|
| JP | 7046511 B2 | 5/1995 |
| KR | 10-1997-0705869 A | 10/1997 |
| KR | 10-2000-0027846 A | 5/2000 |
| KR | 10-2017-0015933 A | 2/2017 |

* cited by examiner

*Primary Examiner* — Jany Richardson
(74) *Attorney, Agent, or Firm* — Morgan, Lewis & Bockius LLP

(57) ABSTRACT

A pseudo-complementary logic network according to this embodiment includes a first logic stage including a first pull-up circuit of an N-type transistor and a first pull-down circuit and a second logic stage including a second pull-up circuit and a second pull-down circuit of an N-type transistor, wherein an output signal of the second logic stage is provided as an input of the first pull-down circuit, and the first pull-up circuit includes the second pull-down circuit.

14 Claims, 9 Drawing Sheets

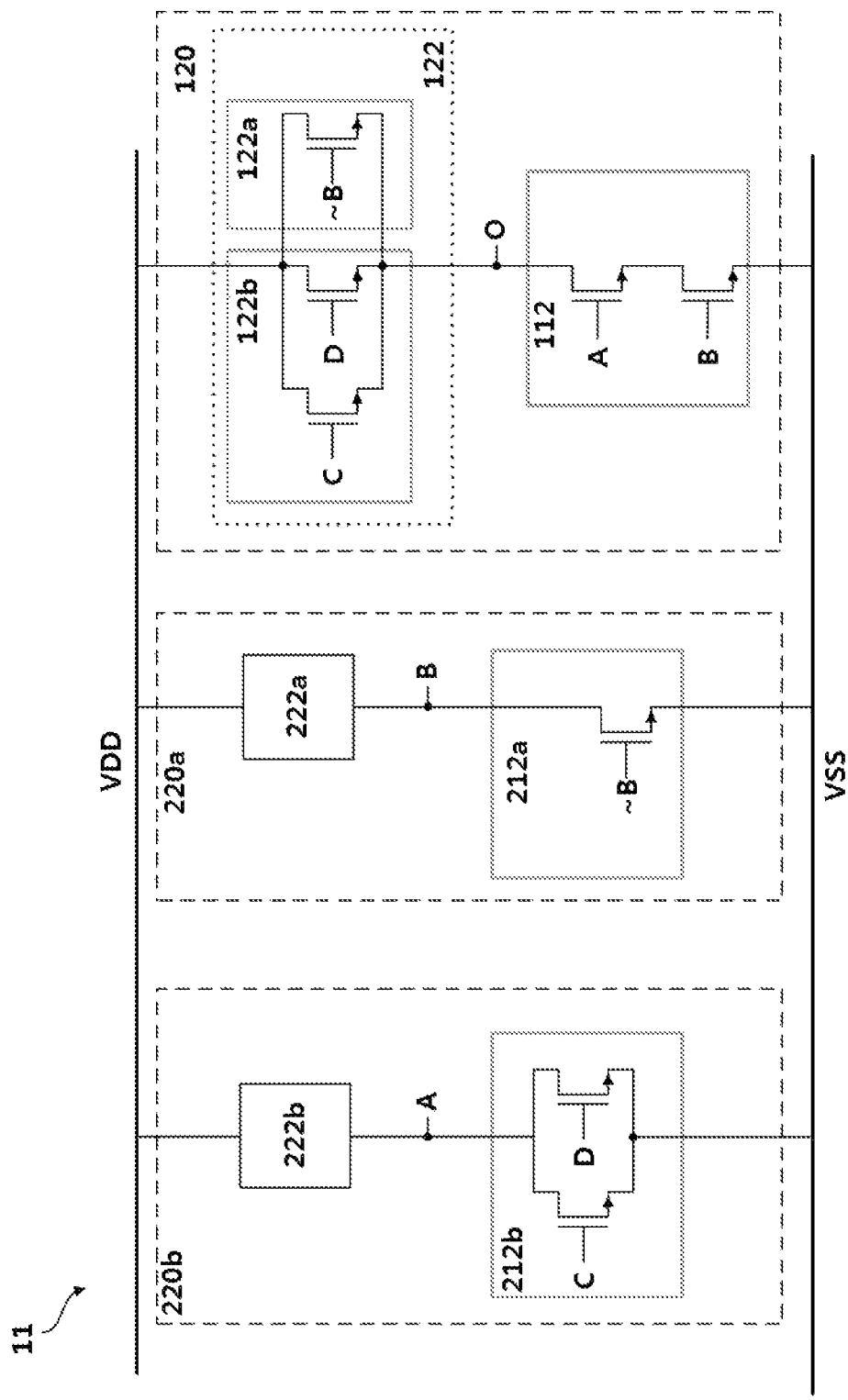

PSEUDO-COMPLEMENTARY LOGIC NETWORK

TECHNICAL FIELD

The present disclosure relates to a pseudo-complementary logic network.

BACKGROUND ART

A process for an organic transistor or a thin-film transistor has a wide application field because the device itself is flexible and transparent and is subject to bottom-up deposition during manufacturing.

DISCLOSURE

Technical Problem

In organic transistors and thin-film transistors, a difference in mobility between n-type and p-type carriers is large, and thus it is difficult to integrate the transistors into a complementary circuit. For this reason, when an integrated circuit is fabricated, the circuit is composed of only transistors of the same type.

However, when a logic is implemented with only N-type transistors or P-type transistors and without using a complementary circuit, power consumption increases due to large static current consumption, and a noise margin is insufficient.

One of the main objects of the present disclosure is to provide a pseudo-complementary unipolar logic device that has a logic implemented with only N-type transistors or P-type transistors among organic transistors or thin-film transistors and that operates pseudo-complementarily to decrease power consumption.

Technical Solution

A pseudo-complementary logic network according to this embodiment includes a first logic stage including a first pull-up circuit of an N-type transistor and a first pull-down circuit and a second logic stage including a second pull-up circuit and a second pull-down circuit of an N-type transistor, wherein an output signal of the second logic stage is provided as an input of the first pull-down circuit, and the first pull-up circuit includes the second pull-down circuit.

A pseudo-complementary logic network according to this embodiment includes a first logic stage including a first pull-down circuit of a P-type transistor and a first pull-up circuit and a second logic stage including a second pull-up circuit of a P-type transistor and a second pull-down circuit, wherein an output signal of the second logic stage is provided as an input of the first pull-up circuit, and the first pull-down circuit includes the second pull-up circuit.

Advantageous Effects

According to this embodiment, since a pull-up circuit and a pull-down circuit operate complementarily, it is possible to decrease static current consumption, thus reducing power consumption and preventing degradation of noise margin characteristics.

DESCRIPTION OF DRAWINGS

FIG. 7 is a transistor-level circuit diagram when the combinational logic of FIG. 6 is implemented with an N-type transistor.

MODES OF THE INVENTION

Figure 1A:
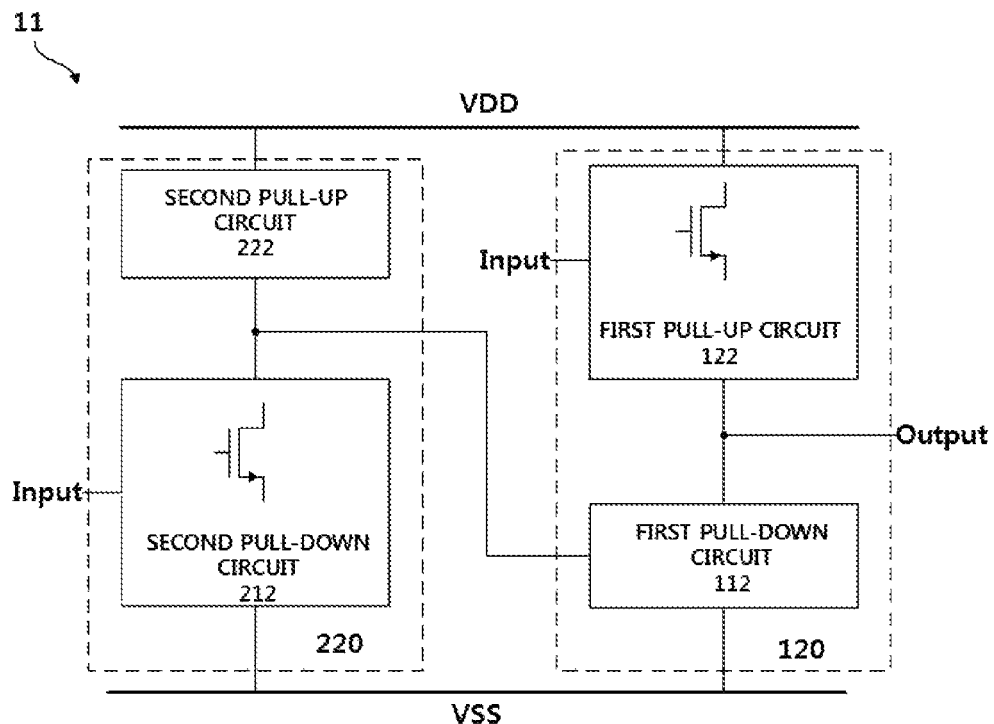
FIG. 1A is a block diagram schematically showing a pseudo-complementary logic network including an N-type transistor according to this embodiment.

Hereinafter, a pseudo-complementary logic network according to this embodiment will be described below with reference to the accompanying drawings. FIG. 1A is a block diagram schematically showing a pseudo-complementary logic network including an N-type transistor according to this embodiment, and FIG. 1B is a block diagram schematically showing a pseudo-complementary logic network including a P-type transistor according to this embodiment.

Referring to FIG. 1A, a pseudo-complementary logic network 11 according to this embodiment includes a first logic stage 120 including a first pull-up circuit 122 of an N-type transistor and a first pull-down circuit 112 and a second logic stage 220 including a second pull-up circuit 222 and a second pull-down circuit 212 of an N-type transistor. An output signal of the second logic stage 220 is provided as an input of the first pull-down circuit 112, and the first pull-up circuit 122 includes the second pull-down circuit 212.

Figure 1B:
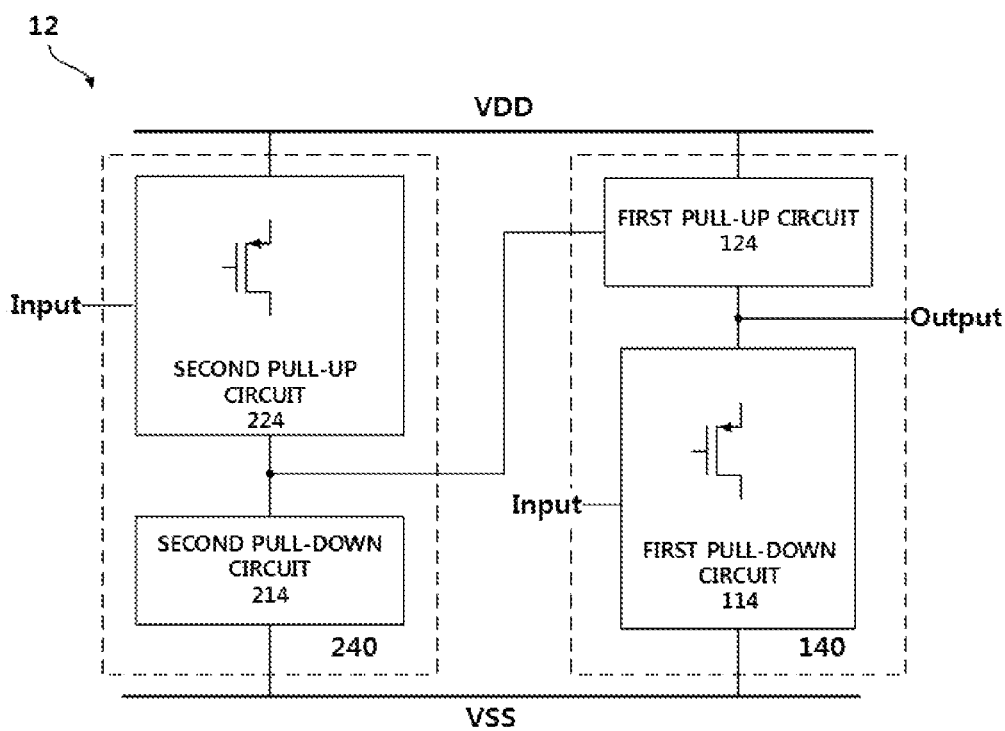
FIG. 1B is a block diagram schematically showing a pseudo-complementary logic network including a P-type transistor according to this embodiment.

Referring to FIG. 1B, a pseudo-complementary logic network 12 according to this embodiment includes a first logic stage 140 including a pull-up circuit 124 and a first pull-down circuit 114 of a P-type transistor and a second logic stage 240 including a second pull-down circuit 214 and a second pull-up circuit 224 of a P-type transistor. An output signal of the second logic stage 240 is provided as an input of the first pull-up circuit 124, and the first pull-down circuit 114 includes the second pull-up circuit 224.

Figure 2A:
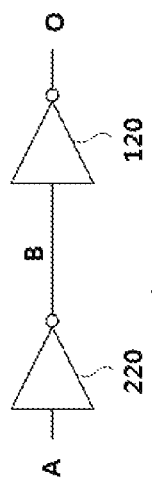
FIG. 2A is a gate-level circuit diagram of a pseudo-complementary logic network according to this embodiment.
Figure 2B:
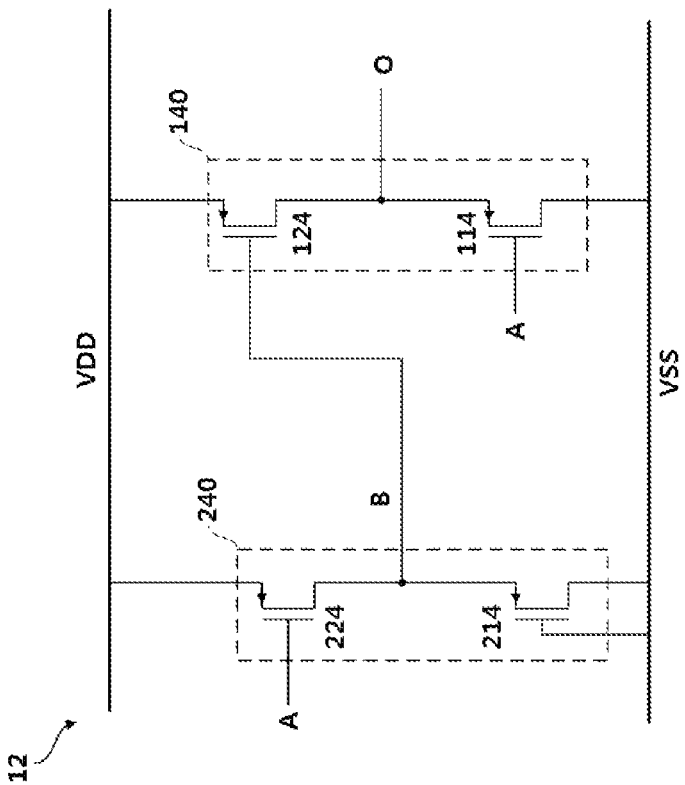
FIG. 2B is a transistor-level circuit diagram of a pseudo-complementary logic network including an N-type transistor.
Figure 2C:
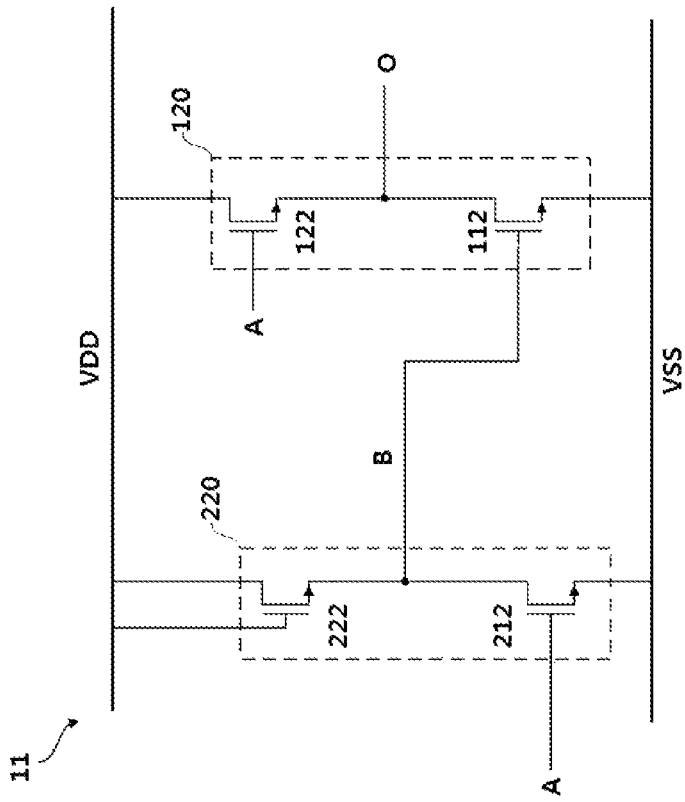
FIG. 2C is a transistor-level circuit diagram of a pseudo-complementary logic network including a P-type transistor.

FIG. 2A is a gate-level circuit diagram of a pseudo-complementary logic network 11 according to this embodiment, FIG. 2B is a transistor-level circuit diagram of a pseudo-complementary logic network 11 including an N-type transistor, and FIG. 2C is a transistor-level circuit diagram of a pseudo-complementary logic network 12 including a P-type transistor. Referring to FIGS. 2A and 2B, when each of the first logic stage 120 and the second logic stage 220 is an inverter consisting of N-type transistors, the first pull-down circuit may be an N-type transistor 112 that receives an output B of the second logic stage 220. The second pull-up circuit may be implemented with a diode-connected transistor 222 that pulls up an output node of the second logic stage 220. According to another embodiment not shown, the second pull-up circuit may be a resistor. In another embodiment not shown, the second pull-up circuit may include a pull-down circuit of a previous logic stage and may include an N-type transistor. The first pull-up circuit may be identical to the second pull-down circuit.

Furthermore, the second pull-up circuit is provided with an inverted input and may be implemented with an N-type transistor that implements a logic corresponding to the De Morgan's laws of the second pull-down circuit.

When a logic high signal is provided as an input A to the pseudo-complementary logic network 11 illustrated in FIG. 2B, the N-type transistor 212, which is the second pull-down circuit, is activated. A logic low signal is provided as the output B of the second logic stage 220. Likewise, the N-type transistor 122, which is the first pull-up circuit identical to the second pull-down circuit, is activated, and thus a logic high signal is output as the output O of the first logic stage 120.

When a logic low signal is provided as the input A of the second logic stage 220, the N-type transistor 212, which is the second pull-down circuit, is cut off. However, the output B of the second logic stage 220 provides a logic high signal through the diode-connected transistor 222. Also, the N-type transistor 112, which is the first pull-down circuit, is provided with a logic high signal and activated, and the first logic stage 120 outputs a logic low signal O.

As in the conventional technique, when a logic high signal is provided as an input A to the second logic stage that uses the diode-connected transistor 222, the N-type transistor 212 is activated. Thus, static current consumption occurs because current can flow to a reference voltage rail VSS through the diode-connected transistor 214.

However, although the first pull-up circuit and the first pull-down circuit of the first logic stage 120 implemented according to this embodiment are implemented with the same type of transistors, the activation and the cut-off are complementary to each other. Therefore, from this configuration, the advantage of being able to reduce static current consumption is provided.

Also, when a signal that swings from a logic low state to a logic high state is provided as an input of the second logic stage 220, a signal for the output B of the second logic stage 220 may swing a driving voltage VDD minus a turn-on voltage of the diode-connected transistor 222 to a reference voltage VSS. On the contrary, when a signal that swings from a logic high state to a logic low state is provided as an input of the first logic stage 120, a signal that swings from the reference voltage VSS to the driving voltage VDD is output.

Accordingly, when a pull-down circuit of a previous logic stage is disposed in a pull-up logic stage, it is possible to reduce the loss of the swing range of the output signal of the corresponding logic stage, and thus it is also possible to reduce the loss of a noise margin.

Referring to FIGS. 2A and 2C, when each of the first logic stage 140 and the second logic stage 240 is an inverter consisting of P-type transistors, the first pull-up circuit may be a P-type transistor 124 that receives an output B of the second logic stage 240. The second pull-down circuit may be implemented with a diode-connected transistor 214 that pulls down an output node of the second logic stage 240. According to another embodiment not shown, the second pull-down circuit may be a resistor. In another embodiment not shown, the second pull-down circuit may include a pull-up circuit of a previous logic stage and, in this case, may include a P-type transistor. The first pull-down circuit may be identical to the second pull-up circuit.

Furthermore, the second pull-down circuit is provided with an inverted input and may be implemented with a P-type transistor that implements a logic corresponding to the De Morgan's laws of the second pull-up circuit.

When a logic high signal is provided as an input of the pseudo-complementary logic network 12 illustrated in FIG. 2C, the P-type transistor 224, which is the second pull-up circuit, is cut off. However, a logic low signal is provided by the diode-connected transistor 214 as an output B of the second logic stage 220.

The P-type transistor 124, which is the first pull-up circuit provided with the logic low signal, is activated, and the P-type transistor 114, which is the first pull-down circuit provided with a logic high signal A, is cut off. Thus, a logic high signal is provided as the output O of the first logic stage 140.

On the contrary, when a logic low signal is provided as the input A of the second logic stage 220, the P-type transistor 224, which is the second pull-up circuit, is activated, and thus a logic high signal is provided as the output B of the second logic stage 220. Also, the P-type transistor 124, which is the first pull-up circuit, is provided with a logic high signal B and cut off, and the P-type transistor 114, which is the first pull-down circuit provided with a logic low signal A, is activated. Thus, the first logic stage 120 outputs a logic low signal O.

As in the conventional technique, when a logic low signal is provided as an input A to the second logic stage that uses the diode-connected transistor 214, the P-type transistor 224 is activated. Thus, static current consumption occurs because current can flow to the reference voltage rail VSS through the diode-connected transistor 214.

However, it can be seen that in the first logic stage according to this embodiment, the first pull-down circuit and the first pull-up circuit are implemented with the same type of transistors, but the activation and the cut-off are complementary to each other. Therefore, from this configuration, the advantage of being able to reduce static current consumption is provided.

Furthermore, when a signal alternating between a logic high state and a logic low state is provided as the input A, the second logic stage 240 that uses the diode-connected P-type transistor only can output a signal that swings from a supply voltage VDD up to the reference voltage VSS increased by the turn-on voltage of the diode-connected P-type transistor.

On the other hand, when the pull-up circuit of a previous logic stage is disposed in the pull-down logic stage, there is no static current consumption because the first pull-up circuit and the first pull-down circuit operate complementarily. Furthermore, when a signal that swings from a logic high state to a logic low state is provided as an input, an output voltage of the first logic stage may swing from the reference voltage VSS up to the driving voltage VDD. Accordingly, it is possible to reduce power consumption and the loss of the signal swing of the corresponding logic stage, and thus it is possible to reduce the loss of the noise margin.

Figure 3:
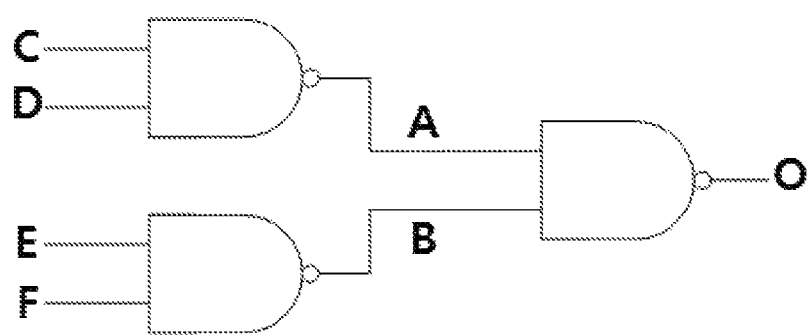
FIG. 3 is a gate-level circuit diagram of a pseudo-complementary logic network according to this embodiment.
Figure 4:
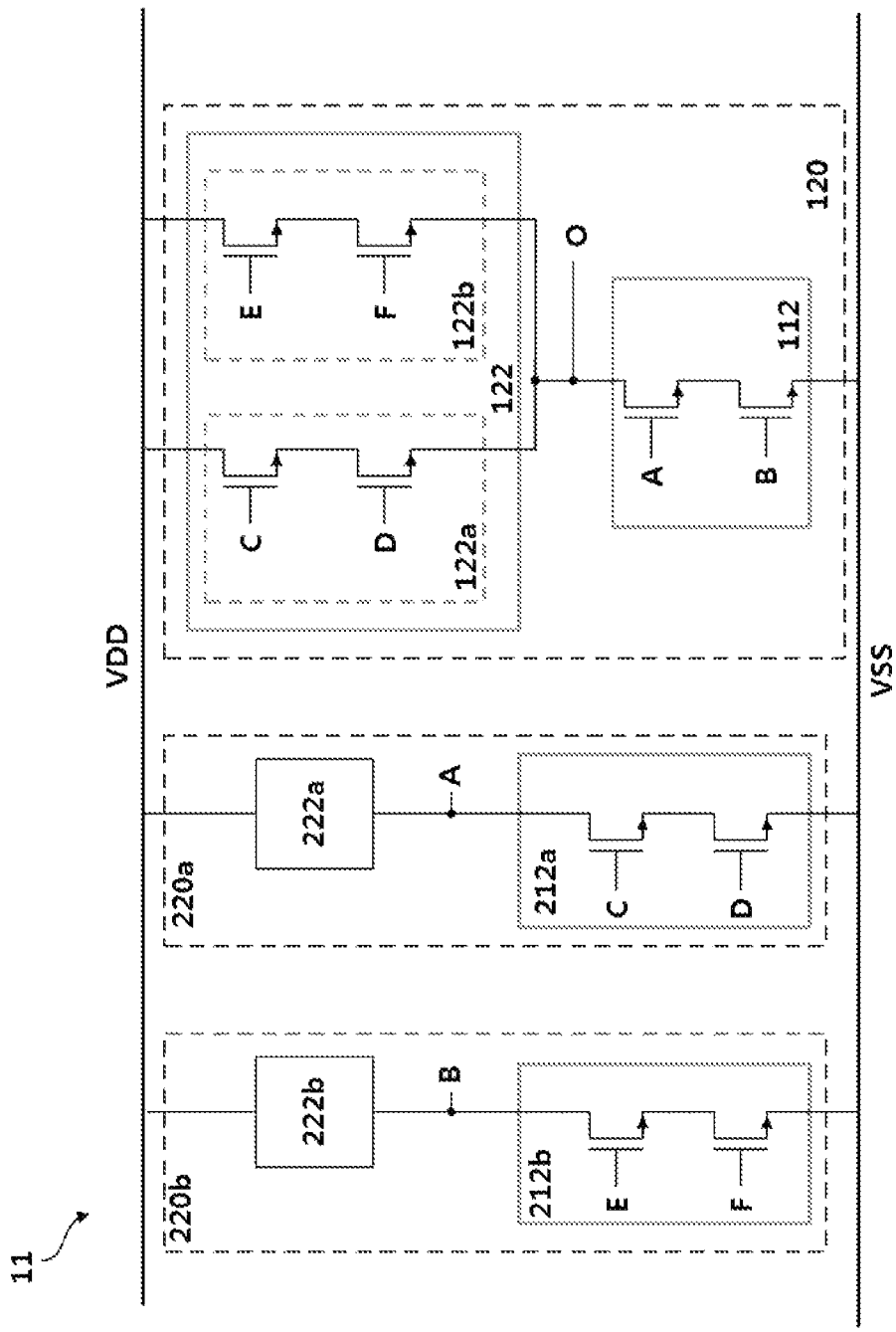
FIG. 4 is a transistor-level circuit diagram of a pseudo-complementary logic network that uses an N-type transistor.
Figure 5:
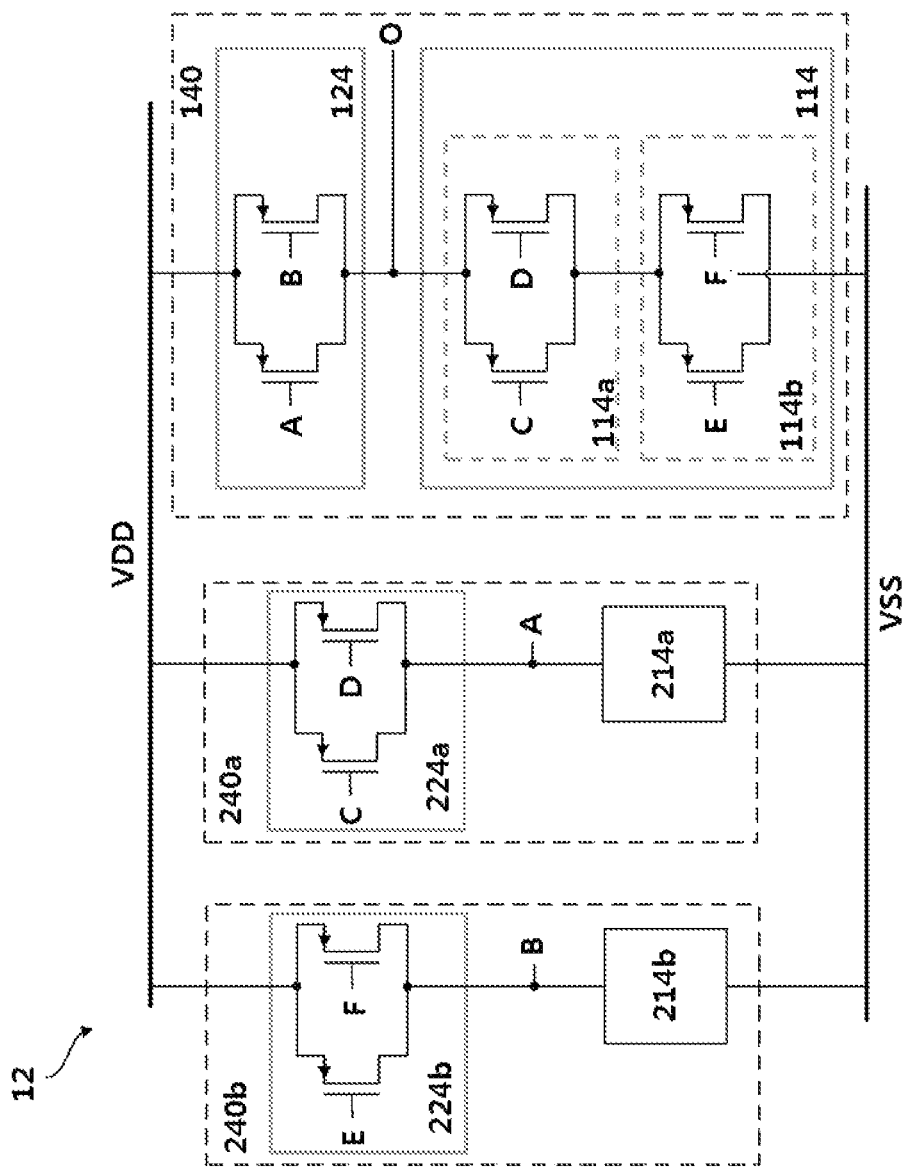
FIG. 5 is a transistor-level circuit diagram of a pseudo-complementary logic network that uses a P-type transistor.

FIG. 3 is a gate-level circuit diagram of a pseudo-complementary logic network according to this embodiment, FIG. 4 is a transistor-level circuit diagram of a pseudo-complementary logic network that uses an N-type transistor, and FIG. 5 is a transistor-level circuit diagram of a pseudo-complementary logic network that uses a P-type transistor.

Referring to FIGS. 3 and 4, a second logic stage 220a of an illustrated pseudo-complementary logic network is a NAND gate that receives signals C and D as inputs and that outputs a signal A, a third logic stage 220b is a NAND gate that receives signals E and F as inputs and that outputs a signal B, and a first logic stage 120 is a NAND gate that receives an output signal A of the second logic stage 220a and an output signal B of the third logic stage 220b and that outputs an output signal O.

The second logic stage 220a and the third logic stage 220b include pull-up circuits 222a and 222b and pull-down circuits 212a and 212b having NAND gates implemented as N-type transistor logics, respectively. As described above, the pull-up circuits 222a and 222b may be provided with a diode-connected transistor, a resistor, an N-type transistor, and an inverted input and may include an N-type transistor that implements a logic according to the De Morgan's laws of the second pull-down circuit.

The truth table of the 2-input NAND is shown in Table 1 below.

TABLE 1

| Input A | Input B | Output |
|---------|---------|--------|
| 0 | 0 | 1 |
| 0 | 1 | 1 |
| 1 | 0 | 1 |
| 1 | 1 | 0 |

(0: logic low, 1: logic high)

That is, a logic low signal is output when both of the two inputs are in a logic high state, and a logic high signal is output when at least one of the two inputs is in a logic low state. Such a NAND function may be implemented as an N-type transistor logic by connecting two N-type transistors to the pull-up circuits of the second logic stage 220a and the third logic stage 220b in series, as illustrated in FIG. 4.

When a logic low input is provided to at least one of the two transistors connected in series in each of the pull-down circuits 212a and 212b, the output node and the reference voltage rail VSS is disconnected, and a logic high signal is output by the pull-up circuit. When a logic high input is provided to both of the two transistors connected in series, the two transistors are activated, and a logic low signal is output.

The NAND gate may be implemented as a P-type transistor logic, like the second logic stage 240a and the third logic stage 240b of FIG. 5. P-type transistors are connected in parallel to pull-up circuits 224a and 224b provided with inputs and are connected to pull-down circuits 214a and 214b. When a logic log input is provided to at least one of the P-type transistors connected in parallel in the pull-up circuit, the corresponding transistor is activated, and a logic high signal is output by the pull-up circuit. That is, the NAND function may be implemented as a P-type transistor logic in which p-type transistors provided with inputs are connected in parallel to each other.

Referring to FIGS. 3 and 4 again, the pull-up circuit 122 of the first logic stage 120 has a circuit 122a identical to the pull-down circuit 212a and a circuit 122b identical to the pull-down circuit 212b which are connected as a P-type transistor logic so as to implement the function of the first logic stage 120. That is, the pull-up circuit 122 of the NAND function of the first logic stage 120 may be implemented as a P-type transistor logic in which the circuit 122a and the circuit 122b are connected in parallel.

The truth table of the pseudo-complementary logic network having the shown configuration of the first logic stage 120 is shown in Table 2 below.

TABLE 2

| C | D | E | F | A | B | O |
|---|---|---|---|---|---|---|
| 0 | 0 | 0 | 0 | 1 | 1 | 0 |
| 0 | 0 | 0 | 1 | 1 | 1 | 0 |
| 0 | 0 | 1 | 0 | 1 | 1 | 0 |
| 0 | 0 | 1 | 1 | 1 | 0 | 1 |
| 0 | 1 | 0 | 0 | 1 | 1 | 0 |
| 0 | 1 | 0 | 1 | 1 | 1 | 0 |
| 0 | 1 | 1 | 0 | 1 | 1 | 0 |
| 0 | 1 | 1 | 1 | 1 | 0 | 1 |
| 1 | 0 | 0 | 0 | 1 | 1 | 0 |
| 1 | 0 | 0 | 1 | 1 | 1 | 0 |
| 1 | 0 | 1 | 0 | 1 | 1 | 0 |
| 1 | 0 | 1 | 1 | 1 | 0 | 1 |
| 1 | 1 | 0 | 0 | 0 | 1 | 1 |
| 1 | 1 | 0 | 1 | 0 | 1 | 1 |
| 1 | 1 | 1 | 0 | 0 | 1 | 1 |

(0: logic low, 1: logic high)

Referring to Table 2 and FIGS. 3 and 4, the pull-up circuit 122 and the pull-down circuit 112 in the first logic stage 120 cannot be activated at the same time. When the pull-down circuit 112 is activated and a logic low signal is provided as an output O, both of the signals A and B have to be logically high. In order for the signal A, which is the output of the second logic stage 220a, to be logically high, the pull-down circuit 212a of the second logic stage 220a has to be cut off. Likewise, in order for the signal B, which is the output of the third logic stage 220b, to be logically high, the pull-down circuit 212b of the third logic stage 220b has to be cut off.

Therefore, the first pull-up circuit 122 in which the circuit 122a identical to the pull-down circuit 212a and the circuit 122b identical to the pull-down circuit 212b are connected as a PMOS logic to implement a NAND function is cut off. Thus, the pull-up circuit 122 is not activated when the signals A and B are logically high.

The pull-up circuit 122 and the pull-down circuit 112 in the first logic stage 120 cannot be cut off at the same time. When the pull-down circuit 112 is cut off and a logic high signal is provided as an output O, at least one of the signals A and B has to be logically low. In order for the signal A, which is the output of the second logic stage 220a, to be logically low, the pull-down circuit 212a of the second logic stage 220a has to be activated. Likewise, in order for the signal B, which is the output of the third logic stage 220b, to be logically low, the pull-down circuit 212b of the third logic stage 220b has to be activated.

Therefore, when at least one of the signals A and B is logically low, at least one of the circuit 122a identical to the pull-down circuit 212a and the circuit 122b identical to the pull-down circuit 212b which are connected as a PMOS logic so as to implement a NAND function in the first pull-up circuit 122 is activated. Thus, the first logic stage is not cut off and provides a logic high signal as an output.

From the above two cases, it can be seen that the pull-up circuit 122 and the pull-down circuit 112 of the first logic stage 120 operate complementarily even though the circuits include transistors of the same type.

Referring to FIGS. 3 and 5, the pseudo-complementary logic network 12 may be implemented with P-type transistors. The second logic stage 240a and the third logic stage

240b include pull-down circuits 214a and 214b and pull-up circuits 224a and 224b having NAND gates implemented as P-type transistor logics, respectively. As described above, the pull-down circuits 214a and 214b may be provided with a diode-connected transistor, a resistor, a P-type transistor, and an inverted input and may include a P-type transistor that implements a logic according to the De Morgan's laws of the second pull-up circuit. The above implementation can be applied across the pseudo-complementary logic network according to this embodiment.

Referring to Table 1 above, when at least one of the two inputs is logically low in the 2-input NAND function, a logic high signal is output. Thus, the pull-up circuits 124, 224a, and 224b may be implemented in the first logic stage 140, the second logic stage 240a, and the third logic stage 240b by connecting two P-type transistors in parallel so as to implement the NAND function.

The pull-down circuit 114 of the first logic stage 140 has a circuit 114a identical to the pull-up circuit 224a of the second logic stage 240a and a circuit 114b identical to the pull-up circuit 224b of the third logic stage 240b which are connected as an N-type transistor logic so as to implement a NAND function.

The pull-up circuit 124 and the pull-down circuit 114 included in the first logic stage 140 according to this embodiment operate complementarily.

In an embodiment, when the pull-up circuit 124 of the first logic stage 140 is electrically connected to the supply voltage rail VDD, at least one of the signals A and B has to be logically low. Therefore, both of the signals C and D have to be logically high, and/or both of the signals E and F have to be logically high. Therefore, the pull-down circuit 114a of the first logic stage 140 is cut off when both of the signals C and D are logically high, and the pull-down circuit 114b is cut off when both of the signals E and F are logically high. Thus, the pull-up circuit 124 and the pull-down circuit 114 cannot be activated at the same time.

In another embodiment, when the pull-up circuit 124 of the first logic stage 140 is cut off, both of the signals A and B have to be logically high. Therefore, one of the signals C and D has to be logically low, and one of the signals E and F has to be logically low. Accordingly, when one of the signals C and D is logically low and one of the signals E and F is logically low, the pull-down circuit 114a of the first logic stage 140 is activated, and the pull-down circuit 114b is also activated. Thus, the pull-up circuit 124 and the pull-down circuit 114 cannot be cut off at the same time. Consequently, the pull-up circuit 124 and the pull-down circuit 114 included in the first logic stage 140 according to this embodiment operate complementarily.

As described above, the pull-up circuit and the pull-down circuit in the first stage implemented with the pseudo-complementary logic network according to this embodiment operate complementary to each other, and thus it is possible to reduce static power consumption. Also, the pull-up circuit and the pull-down circuit do not include a diode-connected device that can limit the swing range, and thus it is possible to prevent the degradation of a noise margin.

Figure 6:
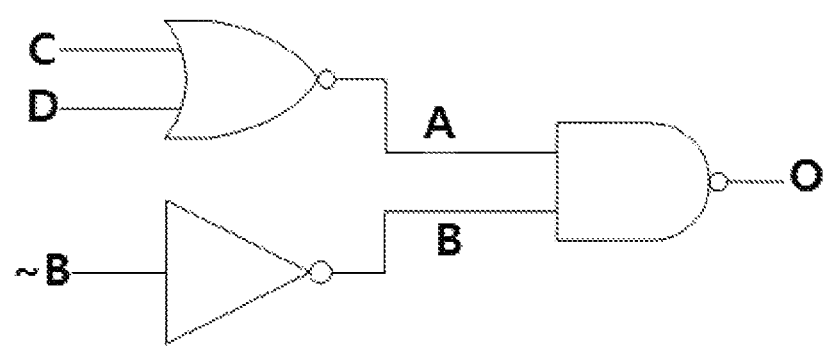
FIG. 6 is a gate-level circuit diagram when any combinational logic is implemented as a pseudo-complementary logic network according to this embodiment.

FIG. 6 is a gate-level circuit diagram when any combinational logic is implemented as a pseudo-complementary logic network according to this embodiment, and FIG. 7 is a transistor-level circuit diagram when the combinational logic of FIG. 6 is implemented with an N-type transistor. Referring to FIGS. 6 and 7, the first logic stage 120 of the complementary logic network 11 of this embodiment is a 2-input NAND gate, an inverter that provides an input to the 2-input NAND gate is the second logic stage 220a, and a NOR gate is the third logic stage 220b.

The pull-down circuit 212b of the third logic stage 220b has two N-type transistors connected in parallel according to an N-type transistor logic so as to implement a 2-input NOR function. Also, when a logic high signal is provided as an input ~B of the N-type transistor, the pull-down circuit 212a of the second logic stage 220a is activated to output a logic low signal and thus implement an inverter.

The pull-up circuit 122 of the first logic stage 120 includes a circuit 122b identical to the pull-down circuit 212b of the third logic stage 220b and a circuit 122a identical to the pull-down circuit 212a of the second logic stage 220a which are connected as a P-type transistor logic so as to implement a NAND function.

The P-type transistor logic that implements the NAND function is formed by connecting the P-type transistors in parallel. Therefore, the pull-up circuit 122 of the first logic stage 120 includes an N-type transistor 122a and two N-type transistors 122b connected in parallel.

Likewise, the pull-down circuit 112 and the pull-up circuit 122 included in the pseudo-complementary logic network 11 according to this embodiment operate complementarily. In an embodiment, when the pull-down circuit 112 is activated, both of the signals A and B have to be logically high. When the signal A is logically high, both of the signals C and D have to be logically low, and thus the pull-up circuit 122b is cut off. When the signal B is logically high, the signal ~B has to be logically low, and thus the pull-up circuit 122a is cut off. Accordingly, when the pull-down circuit 112 is activated, the pull-up circuit 122 is cut off.

In another embodiment, in order for the pull-down circuit 112 to be cut off, one of the signal A or the signal B has to be logically low. In order for the signal A to be logically low, at least one of the signals C and D has to be logically high. Therefore, one of the N-type transistors of the pull-up circuit 122b has to be activated. In order for the signal B to be logically low, the signal ~B has to be logically high. Therefore, the pull-up circuit 122a is activated.

In an embodiment, when a plurality of stages are connected in cascade, the magnitude of a propagated signal may be degraded by the threshold voltage of a transistor. By adjusting the threshold voltages of transistors included in each stage to zero, the propagated signal can be prevented from being degraded. As another example, the magnitude of a signal can be recovered by adding a signal recovery stage to at least every stage.

For example, when each stage is designed with N-type transistors, a signal recovery stage may be disposed for at least every stage, and a voltage higher than the supply voltage VDD of a previous stage and/or a subsequent stage is provided to the signal recovery stage, and thus it is possible to cancel signal degradation due to a threshold voltage. As another example, when each stage is designed with P-type transistors, a voltage lower than the reference voltage VSS of a previous stage and/or a subsequent stage is provided to a signal recovery stage, and thus it is possible to cancel signal degradation due to a threshold voltage.

As described above, it can be seen that with respect to any logic gate according to this embodiment, the pull-down circuit 112 and the pull-up circuit 122 included in the pseudo-complementary logic network 11 operate complementarily.

Therefore, when the pull-down circuit is activated according to the conventional technique, it is possible to reduce a current flowing from a supply power rail to a reference voltage rail through the pull-up circuit and the pull-down circuit, and thus it is possible to reduce power consumption. Furthermore, advantageously, it is possible to improve noise margin characteristics.

Simulation Results

Figure 8A:
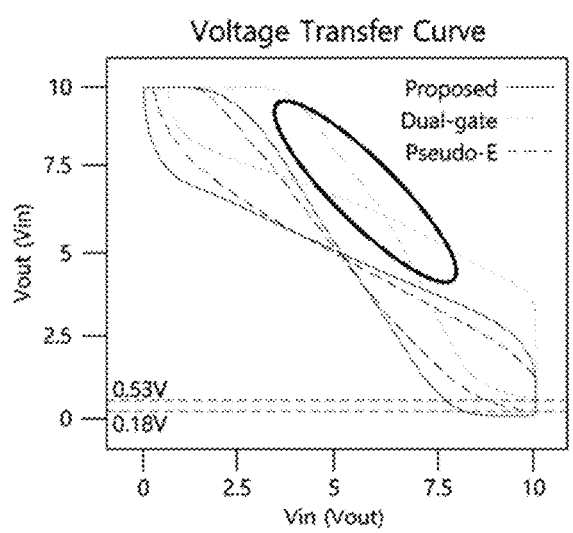
FIGS. 8A, 8B and 8C show computer simulation results of a pseudo-complementary logic network of an N-type transistor inverter-inverter according to this embodiment.
Figure 8B:
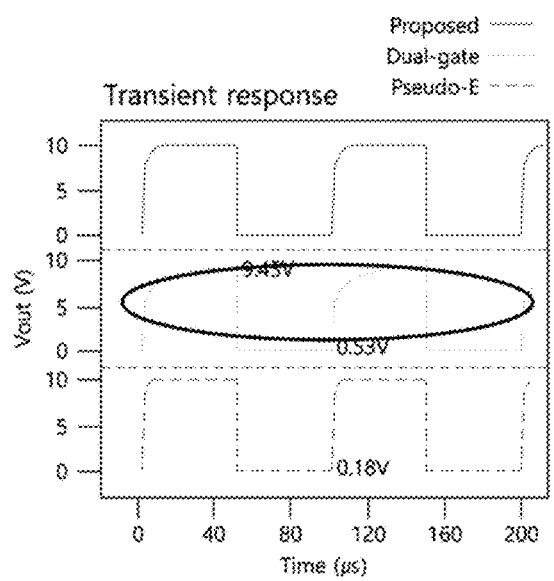
Figure 8C:
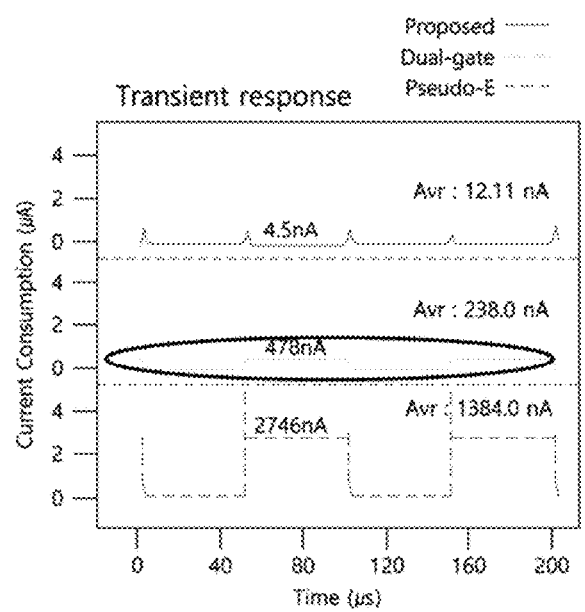

FIGS. 8A, 8B and 8C show computer simulation results of a pseudo-complementary logic network of an N-type transistor inverter-inverter according to this embodiment. FIG. 8A shows the characteristics of an input voltage versus an output voltage. Referring to FIG. 8A, it can be seen that the characteristic curve of the pseudo-complementary logic network according to this embodiment which is shown by a solid line has a high symmetry with respect to an intersection compared to conventional techniques and has a wide recognition range for a high input or a low input.

FIG. 8B shows a transient response corresponding to a square wave input. Referring to FIG. 8B, looking at the characteristic curve of the pseudo-complementary logic network according to this embodiment which is shown by a solid line, it can be seen that the curve rises and falls sharply according to an input signal. Also, it can be seen that in the conventional techniques, which are shown by a dotted line and a dashed line, a swing range is limited as described above. However, it can be seen that this embodiment, which is shown by a solid line, does not cause the limitation of the swing range.

FIG. 8C shows current consumption in a state where a square wave input is provided. Referring to FIG. 8C, in the conventional techniques, which are shown by a dotted line and a dashed line, current consumption increases up to 478 nA and 2749 nA according to an output logic value, reaching 238 nA and 1384 nA on average. However, according to this embodiment, static current consumption is 4.5 nA, and average current consumption is only 12.11 nA. Compared to the conventional techniques and the static current consumption, the static current consumption of this technique is only 0.16% compared to the conventional techniques.

Figure 9A:
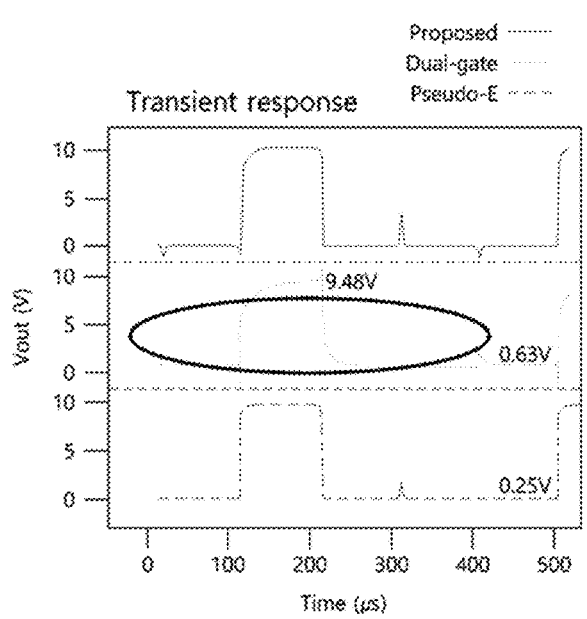
FIGS. 9A and 9B show computer simulation results of a pseudo-complementary logic network of an N-type transistor according to this embodiment.
Figure 9B:
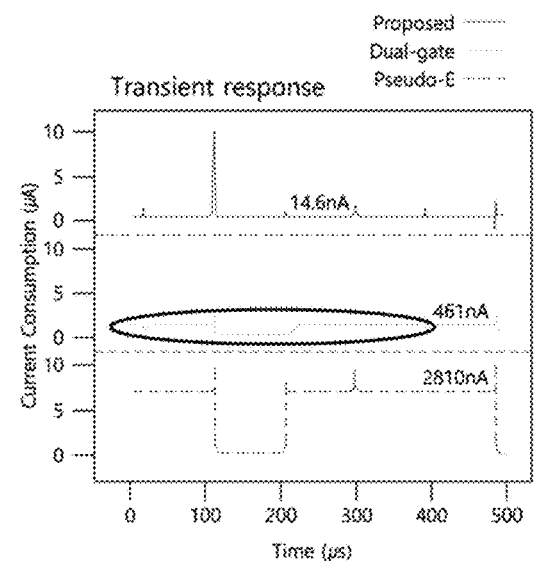

FIGS. 9A and 9B show computer simulation results of a pseudo-complementary logic network of an N-type transistor according to this embodiment. A first logic stage, a second logic stage, and a third logic stage are NAND gates implemented with N-type transistors. FIG. 9A shows a transient response corresponding to an input. FIG. 9A is a diagram showing transient responses of this embodiment and the conventional techniques. Looking at the responses of the conventional techniques, which are shown by a dotted line and a dashed line, it can be seen that a swing range is limited by a turn-on voltage of a diode-connected transistor. However, it can be seen that this embodiment, which is shown by the solid line, does not cause the limitation of the swing range.

FIG. 9B shows current consumption in a state where an input is provided. Referring to FIG. 9B, the conventional techniques, which are shown by a dotted line and a dashed line, have static current consumption reaching 461 nA and 2810 nA. However, in this embodiment, a current in the form of a spike only flows at the moment when the pull-up circuit and the pull-down circuit alternately operate like a CMOS inverter, and the static current consumption is only 14.6 nA. Compared to the conventional techniques and the static current consumption, the current consumption of this technique is only 0.52% compared to the conventional technique.

As described above, according to the pseudo-complementary logic network according to this embodiment, since the swing range of an output signal is not limited, noise margin characteristics are not degraded, and advantageously, it is possible to decrease static current consumption compared to the conventional technique.

The above description has been provided with reference to the embodiments shown in the accompanying drawings in order to help understand the present invention, but the embodiments are merely illustrative for implementation. Accordingly, it will be understood by those skilled in the art that various modifications and equivalents are possible. Therefore, the technical scope of the present invention should be defined by the appended claims.

INDUSTRIAL APPLICABILITY

This has been described above.

The invention claimed is:

1. A pseudo-complementary logic network comprising:
a first logic stage comprising a first pull-up circuit of an N-type transistor and a first pull-down circuit; and
a second logic stage comprising a second pull-up circuit and a second pull-down circuit of an N-type transistor, wherein
an output signal of the second logic stage is provided as an input of the first pull-down circuit,
the first pull-up circuit comprises the second pull-down circuit, and
the same signal is input to the first pull-up circuit and the second pull-down circuit.

2. The pseudo-complementary logic network of claim 1, wherein
the first pull-down circuit includes N-type transistors, and
the N-type transistors included in the first pull-down circuit are connected as an N-type transistor logic so as to implement a function of the first logic stage.

3. The pseudo-complementary logic network of claim 1, further comprising a third logic stage comprising a third pull-up circuit and a third pull-down circuit of an N-type transistor,
wherein the second pull-down circuit and the third pull-down circuit are included in the first pull-up circuit and connected as a P-type transistor logic so as to implement a function of the first logic stage.

4. The pseudo-complementary logic network of claim 3, wherein an output signal of the third logic stage is provided as an input to the first pull-down circuit.

5. The pseudo-complementary logic network of claim 1, further comprising a plurality of logic stages each comprising a pull-down circuit of an N-type transistor,
wherein the second pull-down circuit and each of the pull-down circuits of the N-type transistors are connected as a P-type transistor logic so as to implement a function of the first logic stage and are included in the first pull-up circuit.

6. The pseudo-complementary logic network of claim 1, wherein the second pull-up circuit comprises one of an N-type transistor, a diode-connected N-type transistor, and a resistor.

7. The pseudo-complementary logic network of claim 1, wherein each of the N-type transistors includes one of an organic transistor and a thin-film transistor.

8. A pseudo-complementary logic network comprising:
a first logic stage comprising a first pull-down circuit of a P-type transistor and a first pull-up circuit; and
a second logic stage comprising a second pull-down circuit and a second pull-up circuit of a P-type transistor, wherein an output signal of the second logic stage is provided as an input of the first pull-up circuit, the first pull-down circuit comprises the second pull-up circuit, and the same signal is input to the first pull-down circuit and the second pull-up circuit.

9. The pseudo-complementary logic network of claim 8, wherein the first pull-up circuit includes P-type transistors, and the P-type transistors included in the first pull-up circuit are connected as a P-type transistor logic.

10. The pseudo-complementary logic network of claim 8, further comprising a third logic stage comprising a third pull-down circuit and a third pull-up circuit of a P-type transistor, wherein the second pull-up circuit and the third pull-up circuit are connected as an N-type transistor logic so as to implement a function of the first logic stage and are included in the first pull-down circuit.

11. The pseudo-complementary logic network of claim 10, wherein an output signal of the third logic stage is provided as an input to the first pull-up circuit.

12. The pseudo-complementary logic network of claim 8, further comprising a plurality of logic stages each comprising a pull-up circuit of a P-type transistor, wherein the second pull-up circuit and each of the pull-up circuits of the P-type transistors are connected as an N-type transistor logic so as to implement a function of the first logic stage and are included in the first pull-down circuit.

13. The pseudo-complementary logic network of claim 8, wherein the second pull-down circuit comprises one of a P-type transistor, a diode-connected P-type transistor, and a resistor.

14. The pseudo-complementary logic network of claim 8, wherein each of the P-type transistors includes one of an organic transistor and a thin-film transistor.

* * * * *